(12) United States Patent
Ha et al.

(10) Patent No.: US 8,569,212 B2
(45) Date of Patent: Oct. 29, 2013

(54) SUPERCONDUCTING WIRE

(75) Inventors: Hong Soo Ha, Changwon-si (KR); Sang Soo Oh, Changwon-si (KR); Seok Ho Kim, Changwon-si (KR); Gi Deok Shim, Changwon-si (KR)

(73) Assignee: Korea Electrotechnology Research Institute (KR)

( * ) Notice: Subject to any disclaimer, the term of this patent is extended or adjusted under 35 U.S.C. 154(b) by 86 days.

(21) Appl. No.: 13/037,475

(22) Filed: Mar. 1, 2011

(65) Prior Publication Data

US 2011/0218112 A1 Sep. 8, 2011

(30) Foreign Application Priority Data

Mar. 2, 2010 (KR) .................. 10-2010-0018495

(51) Int. Cl.
*H01B 12/00* (2006.01)

(52) U.S. Cl.
USPC ............................ 505/238; 505/230; 505/237

(58) Field of Classification Search
USPC .......................................... 505/230, 237, 238
See application file for complete search history.

(56) References Cited

U.S. PATENT DOCUMENTS

| 2003/0164749 A1* | 9/2003 | Snitchler et al. | ............ 338/32 S |
| 2006/0079403 A1* | 4/2006 | Lee et al. | ..................... 505/237 |

* cited by examiner

*Primary Examiner* — Paul Wartalowicz
(74) *Attorney, Agent, or Firm* — Park & Associates IP Law, P.C.

(57) ABSTRACT

Disclosed herein is a superconducting wire which is used in, for example, superconducting magnet energy storage systems. The superconducting wire includes: a wire comprising a metal substrate, a superconducting layer and a buffer interposed between the metal substrate and the superconducting layer; and a stabilizer layer plated on the wire, wherein an epoxy resin insulating layer coats the entire surface of the stabilizer layer. The superconducting wire makes it possible to reduce damage to an insulating material when forming the insulating material during the production of the superconducting wire, and it has a uniform surface and can be produced in a simple manner.

5 Claims, 5 Drawing Sheets

SUPERCONDUCTING WIRE

REFERENCE TO RELATED APPLICATIONS

This application claims the priority benefit of Korean Patent Application No. 10-2010-0018495 filed Mar. 2, 2010, the entire contents of which are incorporated herein by reference.

FIELD OF THE INVENTION

The present invention relates to a superconducting wire which is used in, for example, superconducting magnet energy storage systems.

BACKGROUND OF THE INVENTION

In recent years, as our society has developed into a highly advanced information society, telecommunication equipment, computer systems, online service systems, automatic production line control systems and precision control systems have been increasingly distributed. In order to supply high-quality power to such sensitive and important systems, the research and development of superconducting magnetic energy storage (SMES) systems has been active. The superconducting magnetic energy storage (SMES) systems are diverse, including small-scale superconducting magnet energy storage systems for controlling power quality, and large-capacity superconducting magnet energy storage systems for load leveling. Recently, in order to control the power quality of sensitive loads, small-scale superconducting energy storage systems having a capacity on the order of a few MJ have been commercialized and effectively used for industrial and military purposes. The superconducting magnetic energy storage system has as its main component a superconducting magnet obtained by winding a thin tape-shaped superconducting wire. Because the superconducting wire contains a conducting material, it needs to be insulated before it is wound. In the prior art, a film made of insulating material was spirally wound around the outermost layer of the superconducting layer to form an insulating layer, but this film is easily torn, for example, by burs formed at the corners of the superconducting wire. Also, it makes the surface of the superconducting wire non-uniform, causes various problems, and also complicates the production process.

Meanwhile, to the central portion of the superconducting magnet obtained by winding the superconducting wire, a separate lead wire for detecting a quench or the like was connected in order to detect a voltage signal. However, the lead wire has a problem in that it forms a physical/electrical loop that generates a noise by induced electromotive force. In other words, the lead wire causes misjudgment or misoperation due to an electromagnetic noise, thus making quench detection impossible.

SUMMARY OF THE INVENTION

Accordingly, the present invention has been made in view of the problems occurring in the prior art, and it is an object of the present invention to provide a superconducting wire which makes it possible to reduce damage to an insulating material when forming the insulating material during the production of the superconducting wire, and which has a uniform surface and can be produced in a simple manner.

Another object of the present invention is to provide a superconducting wire which allows a voltage signal from a superconducting magnet to be easily sensed without a noise signal.

The objects of the present invention are not limited to the above-described problems, and the other objects will be clearly understood by those skilled in the art from the following description.

To achieve the above objects, the present invention provides a superconducting wire comprising: a wire comprising a metal substrate, a superconducting layer and a buffer interposed between the metal substrate and the superconducting layer; and a stabilizer layer plated on the wire, wherein the entire surface of the stabilizer layer is coated with an epoxy resin insulating layer.

In the present invention, the stabilizer layer may be formed of at least any one of a silver (Ag) stabilizer layer and a copper (Cu) stabilizer layer.

In the present invention, one side of the epoxy resin insulating layer may be coated with a conductive thin layer, and a connection hole that electrically connects the conductive thin layer to the stabilizer layer may be formed at a portion of the epoxy resin insulating layer.

In the present invention, the conductive thin layer may include a plurality of conductive thin layer portions formed so as to be spaced apart from each other and located in parallel, and the connection hole may be formed in plurality so as to correspond to the conductive thin layer portions.

BRIEF DESCRIPTION OF THE DRAWINGS

The above and other objects, features and advantages of the present invention will be more clearly understood from the following detailed description taken in conjunction with the accompanying drawing, in which.

DETAILED DESCRIPTION OF THE INVENTION

Figure 1:
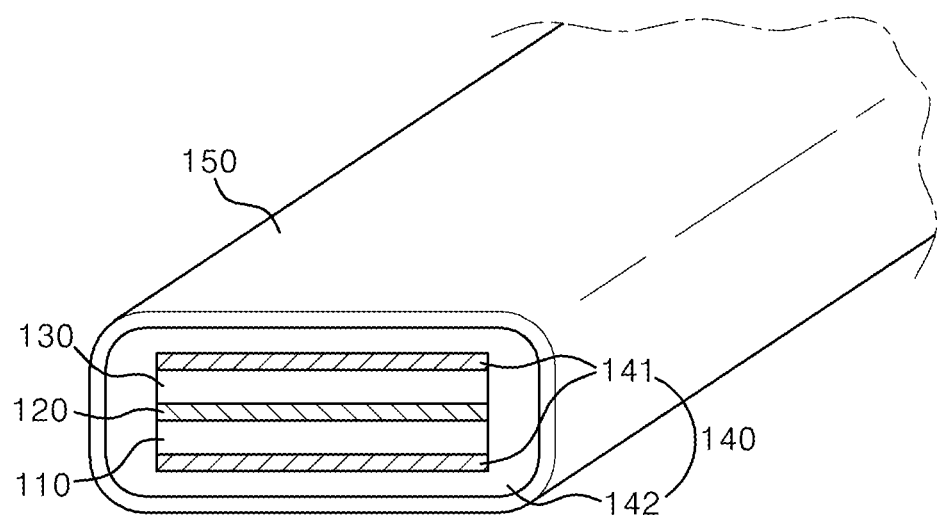
FIG. 1 is a view illustrating a superconducting wire according to a first embodiment of the present invention.

Specific details, including the object, solution and effect of the present invention, are included in the following description and the accompanying drawings. The advantages and features of the present invention, and the way of attaining them, will become apparent by making reference to embodiments described below in conjunction with the accompanying drawings. Like reference numerals refer to like elements throughout the specification.

Hereinafter, the present invention will be described in further detail with reference to the accompanying drawings.

First Embodiment

FIG. 1 is a view illustrating a superconducting wire according to a first embodiment of the present invention.

As shown in FIG. 1, the superconducting wire according to the first embodiment of the present invention comprises a metal substrate 110, a buffer layer 120, a superconducting layer 130, a stabilizer layer 140 and an epoxy resin insulating layer 150.

The metal substrate 110 forms the base of the superconducting wire and imparts flexibility to the superconducting layer 130 made of ceramic material, so that the superconducting wire is easily wound when it is used in, for example, superconducting magnet energy storage systems. Also, the metal substrate 110 has oxidation resistance and is mainly formed of stainless steel, a nickel alloy or the like.

The buffer layer 120 is formed between the metal substrate 110 and the superconducting layer 130 to perform various buffer functions. Specifically, when the superconducting layer 130 is formed at a high temperature of about 700° C. during the production of the superconducting wire, the buffer layer 120 prevents the metal material of the metal substrate 110 from diffusing to the superconducting layer 130 and contaminating the superconducting layer 130, and acts to improve the superconducting property of the superconducting layer 130. For this purpose, the buffer layer 120 comprises a diffusion barrier layer made of ceramic material such as alumina and a property improving layer made of, for example, MgO or MnO.

The superconducting layer 130 is a layer having a superconducting property that is the major property of the superconducting wire, and it is mainly formed of a high-temperature superconducting material based on a rare earth metal.

The stabilizer layer 140 serves as a stabilizer that protects the superconducting wire, composed of the metal substrate 110, the buffer layer 120 and the superconducting layer 130, from the external environment. The stabilizer layer 140 is formed of at least any one of a silver (Ag) stabilizer layer 141 (that is, a first stabilizer layer) and a copper (Cu) stabilizer layer 142 (that is, a second stabilizer layer). The silver stabilizer layer 141 serves to improve the stabilizing property of the stabilizer layer, and the copper stabilizer layer 142 is used to reduce the potential cost burden by the use of expensive silver. In the first embodiment of the present invention, a very thin coat of silver is disposed on outer exposed face of the superconducting wire (i.e., the metal substrate 110 and the superconducting layer 130) to form the silver stabilizer layer 141, and copper is plated on the silver stabilizer layer 141, and preferably around the superconducting wire as shown, to form the copper stabilizer layer 142, thus ensuring a sufficient stabilizing property. However, if necessary, only any one of the silver stabilizer layer 141 and the copper stabilizer layer 142 may be formed.

Also, FIG. 1 shows a superconducting wire structure obtained by coating silver on a broad-width superconducting wire and then cutting the coated wire to form unit superconducting wires, in order to avoid the trouble of having to coat silver onto each of the unit superconducting wires. In order to simplify the production process, coating the silver stabilizer layer 141 on the side may be omitted.

The epoxy resin insulating layer 150 is an insulating layer serving to insulate the superconducting wire made of a conducting material from the external environment. Unlike the prior art, in the first embodiment of the present invention, the entire surface of the stabilizer layer 140 is coated with epoxy resin to form the insulating layer. Thus, forming the epoxy resin insulating layer 150 on the superconducting wire can be easy, and the problem of the insulating material tearing during the production of the superconducting wire does not need to be considered. Accordingly, the occurrence of inferior products can be minimized and the production process cost can be simplified.

Also, the surface of the superconducting wire becomes uniform, thus solving various problems, including the dimensional inaccuracy of the superconducting wire, the inaccuracy of winding thickness according to the number of turns of the superconducting wire when winding the wire to form a magnet, the deformation of the superconducting wire, deterioration in the quality of the superconducting wire, etc. Thus, it is possible to obtain a more predictable magnetic field and intensity for the magnet.

Second Embodiment

Figure 2:
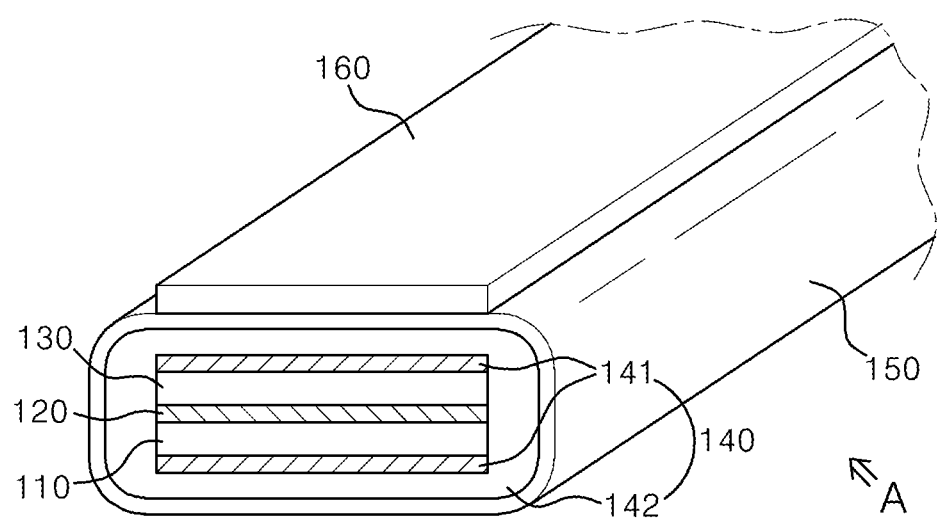
FIG. 2 is a perspective view showing one end of a superconducting wire according to a second embodiment of the present invention.
Figure 3:
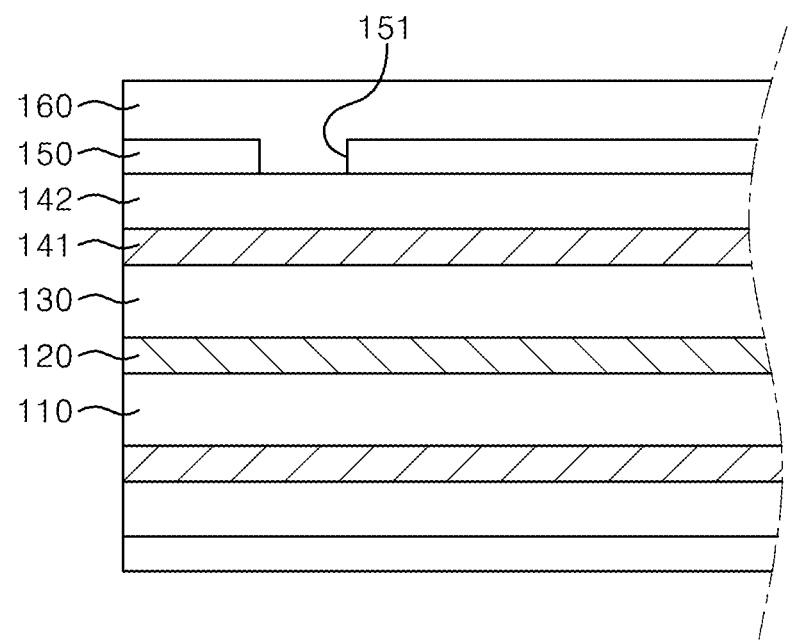
FIG. 3 is a side cross-sectional view taken in a direction perpendicular to the direction of arrow "A" of FIG. 2.
Figure 4:
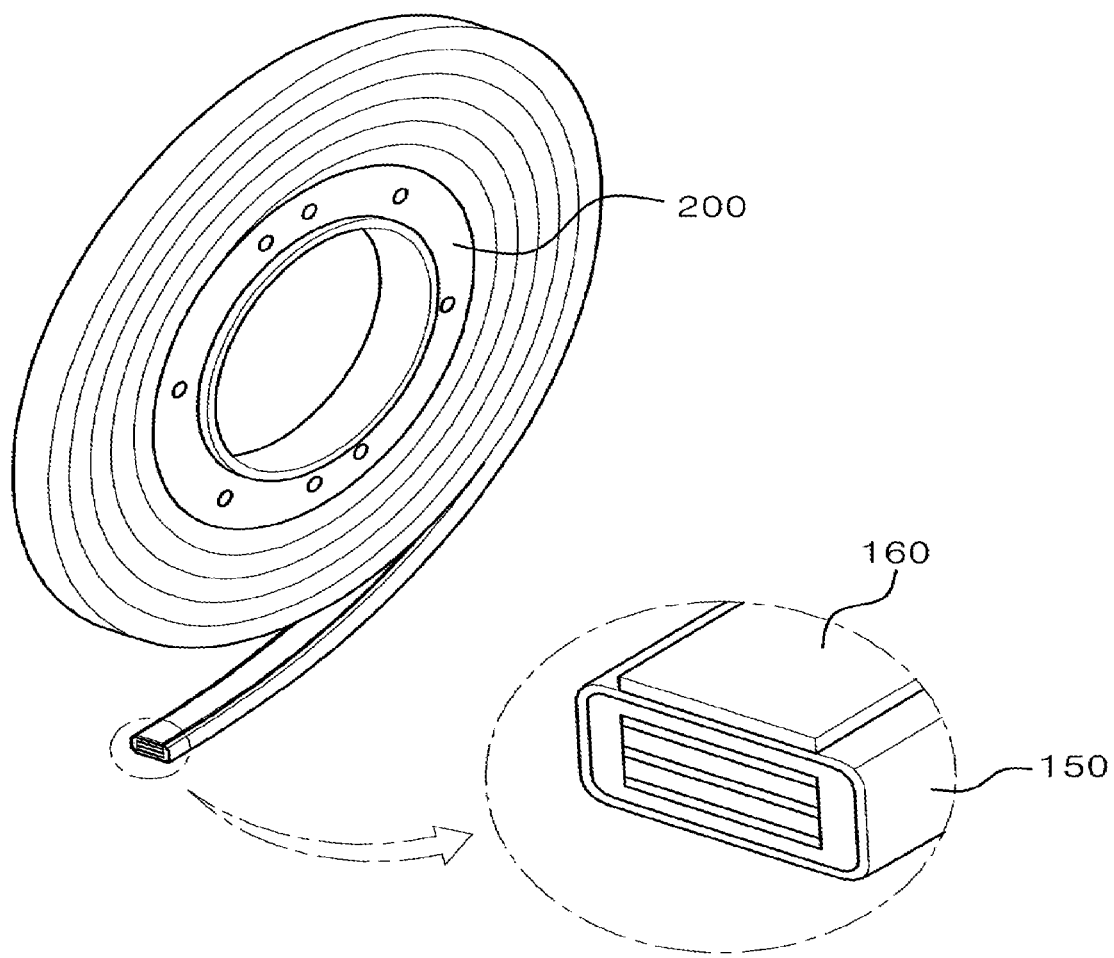
FIG. 4 shows a wound superconducting wire according to a second embodiment of the present invention.

FIGS. 2 to 4 are views illustrating a superconducting wire according to a second embodiment of the present invention. Specifically, FIG. 2 is a perspective view showing one end of the superconducting wire according to the second embodiment of the present invention; FIG. 3 is a side cross-sectional view taken in a direction perpendicular to the direction of arrow "A" of FIG. 2; and FIG. 4 shows a wound superconducting wire according to the second embodiment of the present invention.

As shown in FIGS. 2 to 4, the superconducting wire according to the second embodiment of the present invention comprises a metal substrate 110, a buffer layer 120, a superconducting layer 130, a stabilizer layer 140, an epoxy resin insulating layer 150 and a conductive thin layer 160.

The metal substrate 110, the buffer layer 120, the superconducting layer 130, the stabilizer layer 140 and the epoxy resin insulating layer 150, which are included in the superconducting wire according to the second embodiment of the present invention, have characteristics, functions and materials, which are the same as or similar to those of the metal substrate 110, the buffer layer 120, the superconducting layer 130, the stabilizer layer 140 and the epoxy resin insulating layer 150, which are included in the superconducting wire according to the first embodiment of the present invention. Thus, the detailed description of these defers to the first embodiment of the present invention described above with reference to FIG. 1 and will be omitted.

The conductive thin layer 160 is made of a conductive material such as silver or copper and is formed on one side of the epoxy resin insulating layer 150.

The conductive thin layer 160 is used as a means for sensing a voltage signal to detect a quench or the like during the operation of a superconducting magnet energy storage system, when the superconducting wire is used in the superconducting magnet energy storage system. For this purpose, as shown in FIG. 3, a connection hole 151 is formed at a portion of the epoxy resin insulating layer 150, so that the conductive thin layer 160 and a portion of the stabilizer layer 140 are electrically connected with each other through the connection hole 151. The remaining portion of the stabilizer layer 140 is completely insulated by the epoxy resin insulating layer 150.

As described above, in the superconducting wire according to the second embodiment of the present invention, the conductive thin layer 160 that is a means for sensing a voltage signal is formed integrally on the superconducting wire, unlike the prior art. Accordingly, the conductive thin layer can eliminate loop formation caused by a separate lead wire, so that it can easily sense a voltage signal without a noise signal. Also, it can avoid the trouble of having to install a separate lead wire for sensing a voltage signal, thus simplifying the production process. Furthermore, because the thin conductive layer is formed integrally on the epoxy resin insulating layer 150 having a uniform surface, it can be formed in an easy manner.

Meanwhile, FIG. 4 shows the superconducting wire according to the second embodiment of the present invention, wound around a bobbin 200, wherein a portion of the conductive thin layer 160 is connected with the stabilizer layer 140, and the outer end of the wound wire is exposed to the outside and used as a sensing terminal.

Third Embodiment

Figure 5:
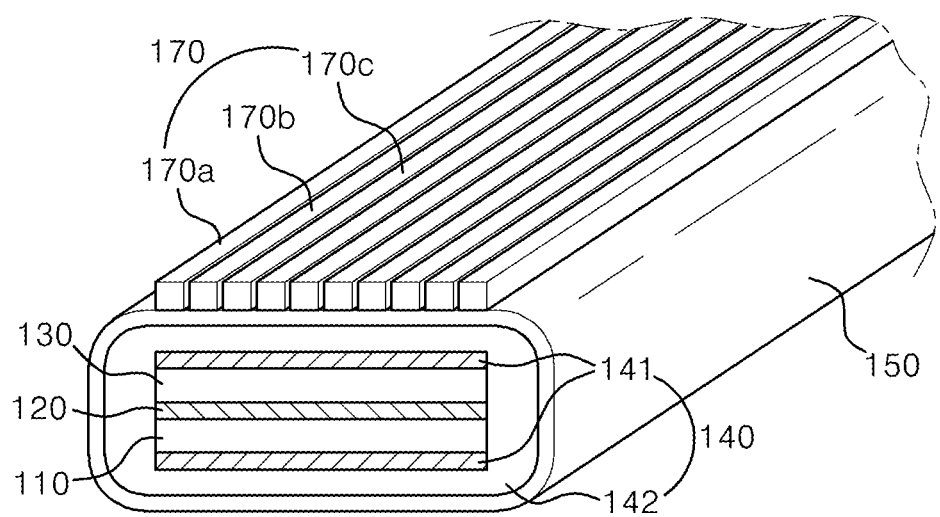
FIG. 5 is a view illustrating a superconducting wire according to a third embodiment of the present invention.

FIG. 5 is a view illustrating a superconducting wire according to a third embodiment of the present invention.

As shown in FIG. 5, the superconducting wire according to the third embodiment of the present invention comprises a metal substrate 110, a buffer layer 120, a superconducting layer 130, a stabilizer layer 140, an epoxy resin insulating layer 150 and a conductive thin layer 170.

The metal substrate 110, the buffer layer 120, the superconducting layer 130, the stabilizer layer 140 and the epoxy resin insulating layer 150, which are included in the superconducting wire according to the third embodiment of the present invention, have characteristics, functions and materials, which are the same as or similar to those of the metal substrate 110, the buffer layer 120, the superconducting layer 130, the stabilizer layer 140 and the epoxy resin insulating layer 150, which are included in the superconducting wire according to the first embodiment and second embodiment of the present invention. Thus, the detailed description thereof defers to the first embodiment of the present invention described above with reference to FIG. 1 and will be omitted.

The conductive thin layer 170 according to the third embodiment of the present invention has characteristics, a function and materials, which are partially identical or similar to those of the conductive thin layer 160 according to the second embodiment of the present invention. However, unlike the conductive thin layer 160 according to the second embodiment of the present invention, in the conductive thin layer 170 according to the third embodiment of the present invention, a plurality of conductive thin layer portions 170a, 179b, 170c . . . are formed in such a manner that they are spaced apart from each other and located in parallel. Also, a plurality of connection holes are formed so as to correspond to the thin layer portions, respectively.

Thus, the superconducting wire according to the third embodiment of the present invention allows a plurality of signals to be sensed through the ends of the plurality of conductive thin layers 170 connected through the respective connection holes (not shown), when the superconducting magnet energy storage system is operated. In other words, it allows signals of various parameters to be sensed at the same time.

As described above, according to the present invention, it is possible to reduce damage to the insulating material when forming the insulating material during the production of the superconducting wire, the surface of the superconducting wire can be made uniform, and the superconducting wire can be produced in a simple manner.

Also, the superconducting wire of the present invention allows a voltage signal from a magnet to be easily sensed without a noise signal.

The invention has been described by reference to certain preferred embodiments; however, it should be understood that it may be embodied in other specific forms or variations thereof without departing from its spirit or essential characteristics. The embodiments described above are therefore considered to be illustrative in all respects and not restrictive, the scope of the invention being indicated by the appended claims rather than by the foregoing description. It is to be interpreted that all changes or modifications derived from the meaning, scope and equivalent concept of the appended claims are within the scope of the present invention.

What is claimed is:

1. A superconducting wire comprising:
   a metal substrate;
   a superconducting layer;
   a buffer interposed between the metal substrate and the superconducting layer;
   a pair of first stabilizer layers, wherein one of the stabilizer layers is disposed on an outer face of the metal substrate and one of the stabilizer layers is disposed on an outer face of the superconducting layer;
   a second stabilizer layer enclosing an entire outer exposed surface of the metal substrate, the superconducting layer, the buffer, and the pair of first stabilizer layers;
   an epoxy resin insulating layer enclosing an entire outer exposed surface of the second stabilizer layer; and
   a conductive layer disposed on an outer face of the epoxy resin insulating layer,
   wherein the epoxy resin insulating layer includes a connection hole formed therein, and wherein the conductive layer is filled in the connection hole such that the second stabilizer layer is electrically connected with the conductive layer through the conductive layer filled in the connection hole.

2. The superconducting wire of claim 1, wherein the first stabilizer layer is formed of a silver (Ag) stabilizer layer, and the second stabilizer layer is formed of a copper (Cu) stabilizer layer.

3. The superconducting wire of claim 1, wherein the superconducting layer is a high-temperature superconducting material based on a rare earth material.

4. A superconducting article comprising the superconducting wire as set forth in claim 1, and further comprising a bobbin, wherein the superconducting wire is wound around the bobbin such that the conductive layer is disposed inwardly in each turn of the superconducting wire.

5. A superconducting wire comprising:
   a metal substrate;
   a superconducting layer;
   a buffer interposed between the metal substrate and the superconducting layer;
   a pair of first stabilizer layers, wherein one of the stabilizer layers is disposed on an outer face of the metal substrate and one of the stabilizer layers is disposed on an outer face of the superconducting layer
   a second stabilizer layer enclosing an entire outer exposed surface of the metal substrate, the superconducting layer, the buffer, and the pair of first stabilizer layers;
   an epoxy resin insulating layer enclosing an entire outer exposed surface of the second stabilizer layer; and
   a plurality of conductive layers disposed on an outer face of the epoxy resin insulating layer, the conductive layers spaced apart from and disposed in parallel relation to one another,
   wherein the epoxy resin insulating layer includes a plurality of connection holes formed at locations overlaying the plurality of conductive layers, and wherein the conductive layers are filled in the connection holes such that the second stabilizer layer is electrically connected with the plurality of conductive layers through the conductive layers filled in the connection holes.

* * * * *